US012486571B2

(12) United States Patent
Panavalappil Kumarankutty et al.

(10) Patent No.: US 12,486,571 B2
(45) Date of Patent: Dec. 2, 2025

(54) ATOMIC LAYER DEPOSITION COATING SYSTEM FOR INNER WALLS OF GAS LINES

(71) Applicant: Applied Materials, Inc., Santa Clara, CA (US)

(72) Inventors: Hanish Kumar Panavalappil Kumarankutty, Bangalore (IN); Yogesh Tomar, Bangalore (IN); Nikshep M. Patil, Bangalore (IN); Hari Venkatesh Rajendran, Bangalore (IN); Kirubanandan Naina Shanmugam, Bangalore (IN); Gayatri Natu, Mumbai (IN); Mahesh Arcot, Mumbai (IN); Senthil Kumar Nattamai Subramanian, Hosur (IN); Steven D. Marcus, San Jose, CA (US); Michael R. Rice, Pleasanton, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 463 days.

(21) Appl. No.: 17/962,378

(22) Filed: Oct. 7, 2022

(65) Prior Publication Data

US 2024/0117491 A1 Apr. 11, 2024

(51) Int. Cl.
*C23C 16/455* (2006.01)
*C23C 16/44* (2006.01)

(52) U.S. Cl.
CPC .... *C23C 16/45544* (2013.01); *C23C 16/4412* (2013.01); *C23C 16/45557* (2013.01)

(58) Field of Classification Search
CPC ............ C23C 16/4404; C23C 16/4412; C23C 16/458; C23C 16/45544; C23C 16/045
See application file for complete search history.

(56) References Cited

U.S. PATENT DOCUMENTS

| | | | |
|---|---|---|---|
| 5,308,399 | A | 5/1994 | Pillhoefer et al. |
| 10,186,400 | B2 | 1/2019 | Wu et al. |
| 10,443,126 | B1 | 10/2019 | Wu et al. |
| 10,573,497 | B2 | 2/2020 | Wu et al. |
| 10,858,741 | B2 | 12/2020 | He et al. |
| 11,251,023 | B2 | 2/2022 | Wu et al. |
| 2008/0113097 | A1 | 5/2008 | Mahajani et al. |

(Continued)

OTHER PUBLICATIONS

PCT International Search Report and Written Opinion for PCT/US2023/034587 dated Feb. 7, 2024.

*Primary Examiner* — Joseph A Miller, Jr.
(74) *Attorney, Agent, or Firm* — Moser Taboada

(57) ABSTRACT

Embodiments of an apparatus for coating a plurality of gas lines are provided herein. In some embodiments, an apparatus for coating a plurality of gas lines via an ALD process includes: an oven having an enclosure that defines an interior volume configured to house the plurality of gas lines, the enclosure having a door configured for transferring the plurality of gas lines into and out of the interior volume; a plurality of inlet ports disposed through a first wall of the enclosure; a plurality of exhaust ports disposed through a second wall of the enclosure; a fluid panel disposed outside of the oven and coupled to the plurality of inlet ports via corresponding ones of a plurality of fluid distribution assemblies; and a foreline disposed outside of the oven and coupled to the plurality of exhaust ports.

20 Claims, 7 Drawing Sheets

(56) References Cited

U.S. PATENT DOCUMENTS

| | | | | |
|---|---|---|---|---|
| 2014/0127404 | A1 | 5/2014 | Yudovsky et al. | |
| 2014/0165910 | A1 | 6/2014 | Shin et al. | |
| 2016/0068960 | A1* | 3/2016 | Jung | C23C 16/52 324/609 |
| 2019/0136372 | A1 | 5/2019 | Zhan et al. | |
| 2019/0338418 | A1 | 11/2019 | Goradia et al. | |
| 2019/0382888 | A1 | 12/2019 | Wu et al. | |
| 2020/0017960 | A1* | 1/2020 | Tudhope | H01J 37/32 |
| 2021/0301395 | A1 | 9/2021 | Wu et al. | |
| 2022/0282375 | A1 | 9/2022 | Price | |

* cited by examiner

ATOMIC LAYER DEPOSITION COATING SYSTEM FOR INNER WALLS OF GAS LINES

FIELD

Embodiments of the present disclosure generally relate to deposition equipment.

BACKGROUND

Various manufacturing processes expose semiconductor process chamber components to high temperatures, high energy plasma, corrosive halogen gases, high stress, and combinations thereof. Such extreme conditions may erode and/or corrode the chamber components, increasing defects. Reducing the defects improve the components' erosion and/or corrosion resistance in such extreme environments.

Protective coatings are typically deposited on chamber components by a variety of methods such as thermal spray, sputtering, ion assisted deposition (IAD), plasma spray, or evaporation techniques. However, such techniques cannot adequately deposit coatings into certain features of the chamber components that have a high aspect ratio or complex geometries. In some cases, special fixtures must be used to direct the precursor gases into complex internal features of gas line and other components of gas distribution systems, which can result in poor quality films, and/or non-conformal films.

Accordingly, the inventors have provided improved methods and apparatus for coating inner walls of gas lines.

SUMMARY

Embodiments of an apparatus for coating a plurality of gas lines are provided herein. In some embodiments, an apparatus for coating a plurality of gas lines via an ALD process includes: an oven having an enclosure that defines an interior volume configured to house the plurality of gas lines, the enclosure having a door configured for transferring the plurality of gas lines into and out of the interior volume; a plurality of inlet ports disposed through a first wall of the enclosure, wherein each of the plurality of inlet ports are configured for coupling to a first end of a corresponding one of the plurality of gas lines; a plurality of exhaust ports disposed through a second wall of the enclosure, wherein each of the plurality of exhaust ports are configured for coupling to a second end of a corresponding one of the plurality of gas lines; a fluid panel disposed outside of the oven and coupled to the plurality of inlet ports via corresponding ones of a plurality of fluid distribution assemblies; and a foreline disposed outside of the oven and coupled to the plurality of exhaust ports.

In some embodiments, an apparatus for coating a plurality of gas lines via an ALD process includes: an oven having an enclosure that defines an interior volume configured to house the plurality of gas lines, the enclosure having a door configured for transferring the plurality of gas lines into and out of the interior volume; a plurality of inlet ports disposed through a first wall of the enclosure and arranged in a vertically spaced apart orientation, wherein each of the plurality of inlet ports are configured for coupling to a first end of a corresponding one of the plurality of gas lines; a plurality of exhaust ports disposed through a second wall of the enclosure and arranged in a vertically spaced apart orientation, wherein each of the plurality of exhaust ports are configured for coupling to a second end of a corresponding one of the plurality of gas lines; a fluid panel disposed outside of the oven and coupled to the plurality of inlet ports via corresponding ones of a plurality of fluid distribution assemblies; and a foreline disposed outside of the oven and coupled to the plurality of exhaust ports.

In some embodiments, a method of simultaneously coating insides of a plurality of gas lines includes: placing a plurality of gas lines in an oven; coupling a first end of each of the plurality of gas lines to a corresponding one of a plurality of inlet ports of the oven; coupling a second end of each of the plurality of gas lines to a corresponding one of a plurality of exhaust ports of the oven; and flowing one or more process fluids from the plurality of inlet ports through the plurality gas lines to the plurality of exhaust ports to coat inside walls of the plurality of gas lines via an ALD process.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
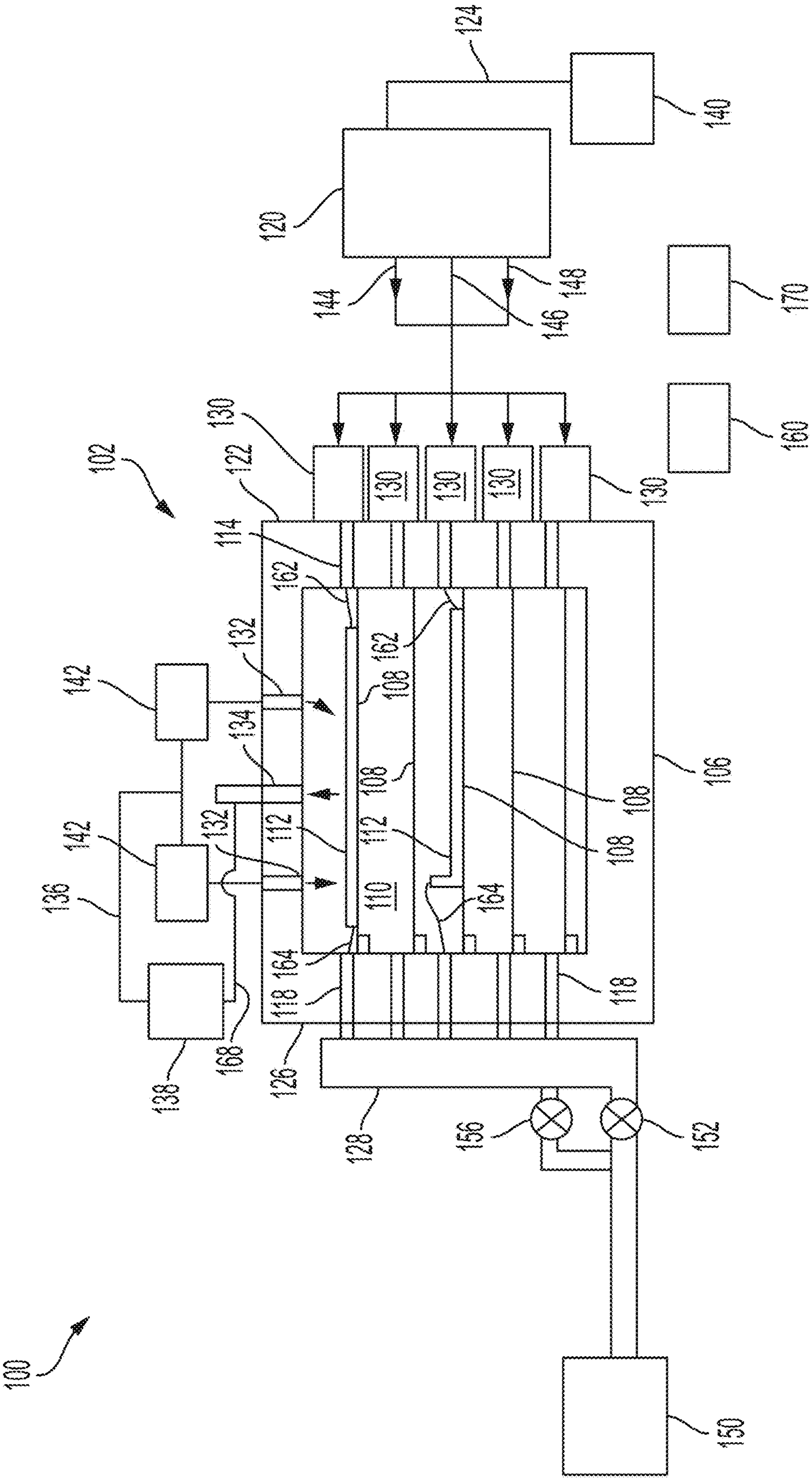
FIG. 1 depicts a schematic view of an apparatus for coating a plurality of gas lines in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of an apparatus for coating a plurality of gas lines via atomic layer deposition (ALD) techniques are provided herein. The ALD techniques are used to advantageously deposit $AlO_x$ film, for example, $Al_2O_3$, on gas lines inner walls of various configurations and sizes, for example, having a length to diameter or depth to width ratios of about 10:1 to about 300:1 (e.g., the inside of a gas line). The $AlO_x$ film advantageously reduces particle generation from the gas lines during use and improves the life of the gas lines. The apparatus may comprise an oven configured for coating multiple gas lines, or weldments, simultaneously. Such an arrangement advantageously increases throughput and reduces precursor consumption.

The precursors used for the coatings may be organometallic or inorganic chemicals, such as TMA, H2O, and ozone, maintained at specified temperature & vapor pressure in an ampoule. With the process regime pressure and temperature, the deposition is carried out under surface reaction limited conditions to obtain conformal coatings and good step coverage, for example, at temperatures of about 300 degrees Celsius and at pressures ranging from about 1 Torr to about 100 Torr. The process pressure is optimized and controlled by gas flows and the throttle valve position in conjunction with the rough pump. The system outlet is connected to a dedicated rough pump. A throttle valve located along the system exhaust line is used to enable slow and gradual pumping through the rough pump.

FIG. 1 depicts a schematic view of an apparatus 100 for coating a plurality of gas lines in accordance with at least some embodiments of the present disclosure. The apparatus 100 generally includes an oven 102 having an enclosure 106 that defines an interior volume 110 configured to house the plurality of gas lines 112. The plurality of gas lines 112 may be held in the oven 102 in any suitable manner. For example, as depicted in FIG. 1, the plurality of gas lines 112 may be disposed on a plurality of trays 108 (discussed in more detail below). Alternatively, in some embodiments, the plurality of gas lines 112 may hung or held from a sidewall of the enclosure 106. In other examples, the plurality of gas lines 112 may be arranged on a rotating fixture disposed in the interior volume 110. The oven 102 is configured to facilitate coating the plurality of gas lines 112 via an atomic layer deposition (ALD) process. The oven 102 may advantageously coat interior walls of the plurality of gas lines 112 having various shapes and sizes that may be otherwise difficult coat.

The oven 102 includes a plurality of inlet ports 114 and a plurality of exhaust ports 118. In some embodiments, the plurality of inlet ports 114 are disposed through a first wall 122 of the enclosure 106. The plurality of inlet ports 114 are coupled to a fluid panel 120 for delivering process fluids to the oven 102. A first end of each of the plurality of gas lines 112 is fluidly coupled to one of the plurality of inlet ports 114 via one of a plurality of first conduits 162. In some embodiments, the plurality of exhaust ports 118 are disposed through a second wall 126 of the enclosure 106. A second end of each of the plurality of gas lines 112 is fluidly coupled to one of the plurality of exhaust ports 118 via one of a plurality of second conduits 164. The plurality of exhaust ports 118 are coupled to a foreline 128 for exhausting the process fluids from the plurality of gas lines 112. As such, in use, each of the plurality of gas lines 112 act as individual ALD chambers, disposed in the oven 102 that is configured to provide the temperature and pressure conditions to facilitate good film coverage on interior walls of the plurality of gas lines 112.

In some embodiments, the oven 102 includes one or more recirculation inlet ports 132 and a recirculation output port 134 for facilitating heating and cooling of the interior volume 110. For example, one or more blowers 142 may be coupled to the enclosure 106 to deliver a gas, such as nitrogen gas. For a heating cycle, the gas may be heated via a heating element 138 and then carried from the heating element 138 to the interior volume 110 via conduit 136. Conduit 136 may be coupled to the one or more blowers 142 to flow the gas that is heated into the interior volume 110. The recirculation output port 134 may divert the gas back to the heating element 138 via conduit 168 for reheating and recirculation. In some embodiments, the interior volume 110 is maintained at about 250 to about 350 degrees Celsius during processing.

For a cooling cycle, the gas traps heat from the plurality of gas lines 112 and diverts the heated gas via conduit 168 to the heating element 138, which may act as a heat exchanger to cool the heated gas. The cooled gas may then be flowed back into the interior volume 110 via the conduit 136 and one or more blowers 142. In some embodiments, the one or more recirculation inlet ports 132 consist of two such ports.

The fluid panel 120 is generally disposed outside of the oven 102 and coupled to the plurality of inlet ports 114, for example, via corresponding ones of a plurality of fluid distribution assemblies 130. The fluid panel 120 may house process fluid sources for performing the coating process described herein. A plurality of process fluid supply lines may run from the fluid panel 120 to each of the plurality of fluid distribution assemblies 130. For example, in some embodiments, the plurality of process fluid supply lines comprise a first process fluid supply line 144, a second process fluid supply line 146, and a third process fluid supply line 148. In some embodiments, the first process fluid supply line 144 comprises a trimethylaluminium (TMA) supply line. In some embodiments, the second process fluid supply line 146 comprises a nitrogen gas supply line. In some embodiments, the third process fluid supply line 148 comprises a water supply line. In some embodiments, the apparatus 100 includes a purge source 140 coupled to the fluid panel 120 for purging the plurality of process fluid supply lines, as needed. In some embodiments, the purge source 140 comprises ozone and is coupled to the fluid panel 120 via a supply line 124.

The foreline 128 (described in more detail below) and is generally disposed outside of the oven 102 and coupled to the plurality of exhaust ports 118. For example, the foreline 128 may be fastened to an outer surface of the enclosure 106. The foreline 128 is coupled to a pump 150 configured to facilitate exhausting the interior volumes of the plurality of gas lines 112. The foreline 128 may include an isolation valve 152 for maintenance and safety. One or more valves 156 that are normally closed may be coupled to the foreline 128 to prevent exhausting of the plurality of gas lines 112 when not desired during the coating process.

The apparatus 100 may include additional racking to facilitate loading and unloading of the plurality of trays 108 and the plurality of gas lines 112. For example, the apparatus may include a loading rack 160. The loading rack 160 may include structures or features configured to hold a plurality of trays 108. The plurality of gas lines 112 may be arranged or assembled on corresponding ones of the plurality of trays 108 on the loading rack 160 before transfer to the oven 102. In some embodiments, each tray of the plurality of trays 108 is transferred individually from the loading rack 160 to the interior volume 110. In some embodiments, the entire loading rack 160, with the plurality of gas lines 112, may be placed in the oven 102 for processing. In some embodiments, the apparatus may include an unloading rack 170 having structures or features to hold the plurality of trays 108 after processing. The unloading rack 170 may facilitate easy removal of the processed or coated plurality of gas lines 112. Once the plurality of gas lines 112 are removed, the empty ones of the plurality of trays 108 may be transferred to the loading rack 160 for reuse.

Figure 2:
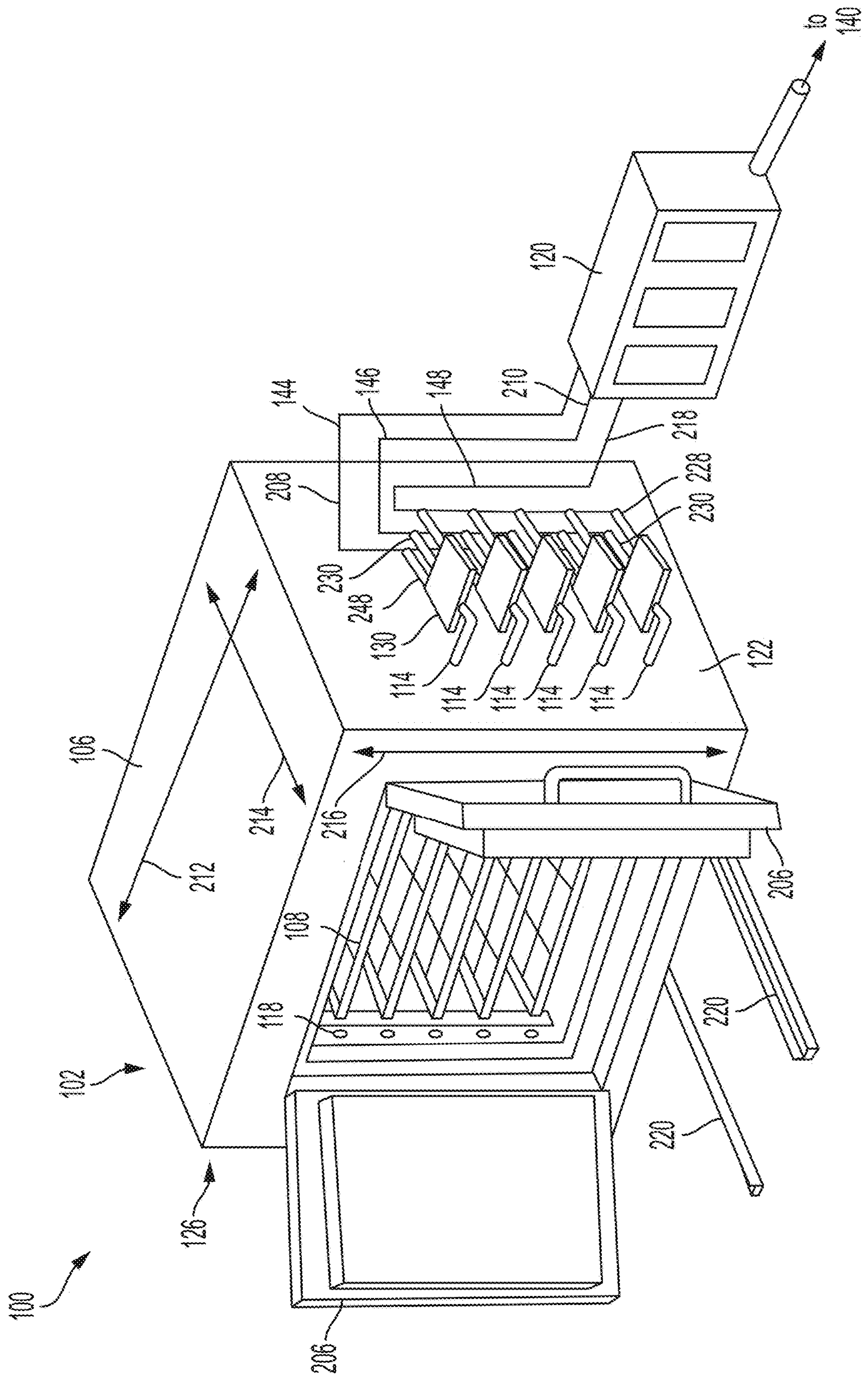
FIG. 2 depicts a schematic top isometric of an apparatus for coating a plurality of gas lines in accordance with at least some embodiments of the present disclosure.

FIG. 2 depicts a schematic top isometric of an apparatus for coating a plurality of gas lines in accordance with at least some embodiments of the present disclosure. The enclosure 106 of the oven 102 generally includes one or more openings for transferring the plurality of gas lines 112. For example, the enclosure 106 may include one or more doors 206 configured for transferring the plurality of gas lines 112 into and out of the interior volume 110. FIG. 2 depicts a set of two doors disposed on a single wall of the enclosure 106. However, in some embodiments, the one or more doors 206 may be disposed on multiple walls of the enclosure. The one or more doors 206 may form a seal (not shown) with the enclosure 106 in a suitable manner, for example, via one or more o-rings, or the like. In some embodiments, the apparatus 100 is configured to arrange the plurality of gas lines 112 in a vertically spaced apart orientation.

In some embodiments, the plurality of inlet ports 114 are arranged in a vertically spaced apart orientation. In some embodiments, the plurality of fluid distribution assemblies 130 are arranged in a vertically spaced apart orientation. For example, each of the plurality of fluid distribution assemblies 130 may be disposed adjacent or proximate a corresponding one of the plurality of inlet ports 114. In some embodiments, the first process fluid supply line 144 includes a first integration line 208 extending from the fluid panel 120 and a plurality of branches 248 extending from the first integration line 208 to the plurality of fluid distribution assemblies 130. In some embodiments, the second process fluid supply line 146 includes a second integration line 210 extending from the fluid panel 120 and a plurality of second branches 230 extending from the second integration line 210 to the plurality of fluid distribution assemblies 130. In some embodiments, the third process fluid supply line 148 includes a third integration line 218 extending from the fluid panel 120 and a plurality of third branches 228 extending from the third integration line 218 to the plurality of fluid distribution assemblies 130.

As discussed, above, each of the plurality of inlet ports 114 is configured for coupling to a first end of a corresponding one of the plurality of gas lines 112. In some embodiments, the plurality of inlet ports 114 are disposed proximate the one or more doors 206 for ease of reach and connection to the plurality of first conduits 162. In some embodiments, the plurality of trays 108 are disposed in the interior volume 110 to hold the plurality of gas lines 112.

In some embodiments, the plurality of exhaust ports 118 are arranged in a vertically spaced apart orientation. Each of the plurality of exhaust ports 118 are configured for coupling to a second end of a corresponding one of the plurality of gas lines 112. In some embodiments, the plurality of exhaust ports 118 are disposed proximate the one or more doors 206 for ease of reach and connection to the plurality of second conduits 164. During processing, inner volumes of the plurality of gas lines 112 are not exposed to the interior volume 110 of the oven 102.

In some embodiments, the oven 102 has a width 212 of about 5 to about 9 feet. In some embodiments, the oven 102 has a length 214 of about 4 to about 7 feet. In some embodiments, the oven 102 has a height 216 of about 4 to about 7 feet. The plurality of trays 108 may be sized to suitably hold the plurality of gas lines 112 in the interior volume 110 of the oven 102. One or more lift fixture guides 220 may be provided proximate the one or more doors 206 for aiding lift fixtures (e.g., lifting fixture 400) in aligning, loading, or unloading the plurality of trays 108.

Figure 3:
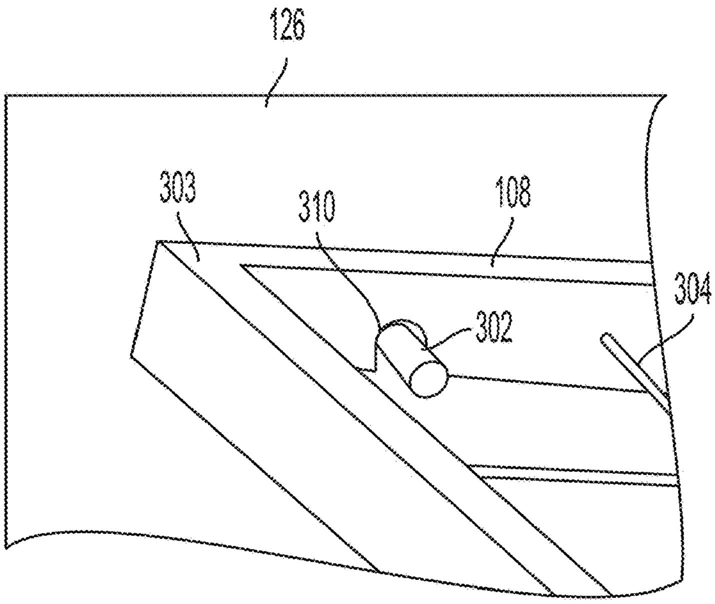
FIG. 3 depicts an isometric view of a rack disposed in the interior volume in accordance with at least some embodiments of the present disclosure.

FIG. 3 depicts an isometric view of a rack disposed in the interior volume in accordance with at least some embodiments of the present disclosure. In some embodiments, the rack of the plurality of trays 108 may include a plurality of slots 310 (one shown in FIG. 3). Each of the plurality of slots 310 may be configured to receive a pin 302 that extends from sidewalls of the enclosure 106, such as from the second wall 126. Each of the pins 302 may rest in the plurality of slots 310 to facilitate supporting and holding the plurality of trays 108. In some embodiments, for each tray of the plurality of trays 108, the first wall 122 may include one or more pins 302 aligned along a common horizontal plane with one or more pins 302 extending from the second wall 126. In some embodiments, the plurality of trays 108 comprise a frame 303 and a grid 304, or mesh, extending across the frame 303.

Figure 4:
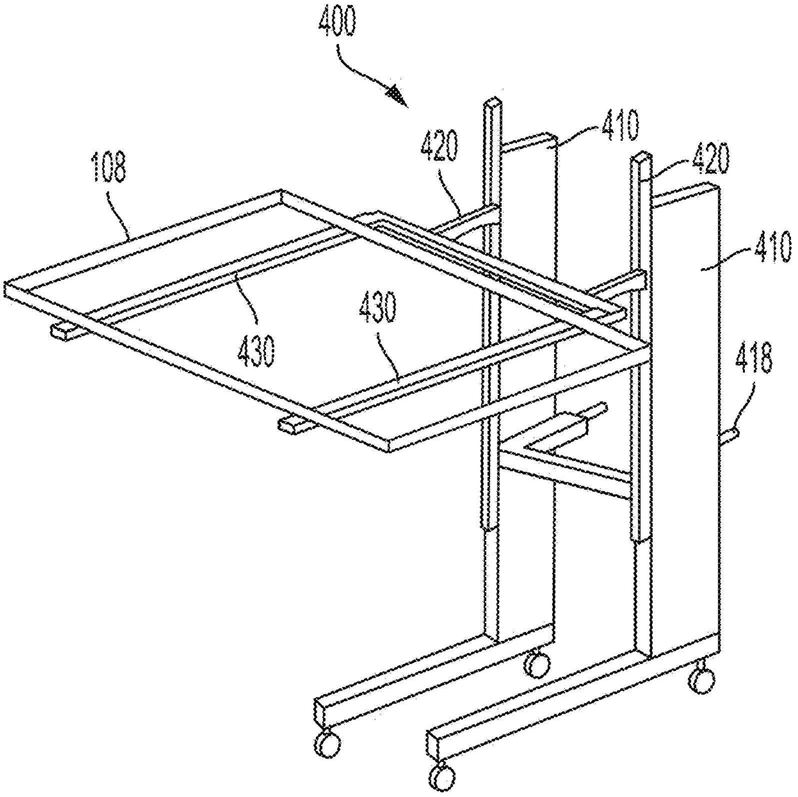
FIG. 4 depicts an isometric view of a lifting fixture in accordance with at least some embodiments of the present disclosure.

FIG. 4 depicts an isometric view of a lifting fixture 400 in accordance with at least some embodiments of the present disclosure. The lifting fixture 400 generally includes a fixed portion 410 and a lift portion 420, where the lift portion 420 may be raised or lowered with respect to the fixed portion 410. In some embodiments, the lift portion 420 may include support arms, such as a fork 430, configured to support a tray of the plurality of trays 108. In some embodiments, the lift portion 420 may be moved manually, via handles 418. In some embodiments, the lift portion 420 may be moved via electronic actuators, a pulley system, gears and chains, or the like.

Figure 5:
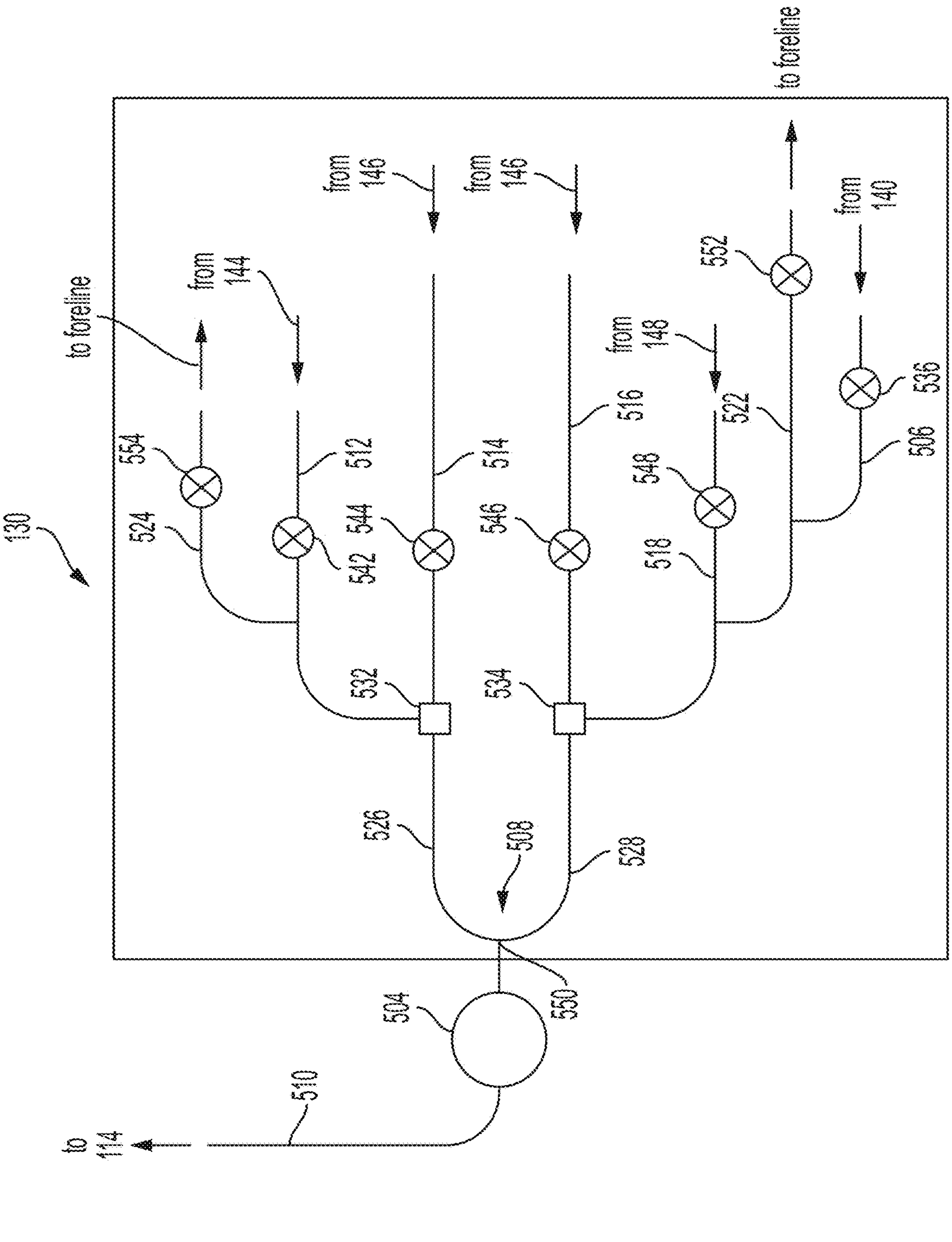
FIG. 5 depicts a schematic top view of a fluid distribution assembly in accordance with at least some embodiments of the present disclosure.

FIG. 5 depicts a schematic top view of a fluid distribution assembly in accordance with at least some embodiments of the present disclosure. In some embodiments, the plurality of fluid distribution assemblies 130 include a plurality of process fluid supply lines that converge into a single inlet line 510 that is coupled to each of the plurality of inlet ports 114. In some embodiments, the plurality of fluid distribution assemblies include a Y shaped weldment 508 configured to merge multiple process fluids while minimizing chemical vapor deposition in the Y shaped weldment 508.

For example, in some embodiments, the first process fluid supply line 144 containing a first fluid may be coupled to a first conduit 512 having a first valve 542 for controlling a flow of the first fluid through the first conduit 512. In some embodiments, the second process fluid supply line 146 may be coupled to a first carrier conduit 514 having a first mass flow controller 544 for controlling a flow of the second fluid through the first carrier conduit 514. The first conduit 512 may be coupled to the first carrier conduit 514 via a first three port pulsing valve 532. The first carrier conduit 514 may provide a carrier gas or purge gas. A first process fluid may comprise a mixture of the first fluid and the second fluid. A first process fluid line 526 is coupled to the first three port pulsing valve 532 at one end and a junction 550 of the Y shaped weldment 508 at another end. The first three port pulsing valve 532 may be configured to pulse the first fluid into the first process fluid line 526 (and consequently into one of the plurality of inlet ports 114). In some embodiments, the first three port pulsing valve 532 is configured to provide continuous flow from the first carrier conduit 514 and pulsed flow from the first conduit 512. A first exhaust line 524 may extend from the first conduit 512 to a foreline, such as foreline 128 or a separate foreline, of the apparatus 100. The first exhaust line 524 may include a first exhaust valve 554 that is normally closed.

In some embodiments, the third process fluid supply line 148 containing a third fluid may be coupled to a third conduit 518 having a third valve 548 for controlling a flow of the third fluid through the third conduit 518. In some embodiments, the second process fluid supply line 146 may be coupled to a second carrier conduit 516 having a second mass flow controller 546 for controlling a flow of the second fluid through the second carrier conduit 516. The third conduit 518 may be coupled to the second carrier conduit 516 via a second three port pulsing valve 534. The second carrier conduit 516 may provide a carrier gas or purge gas. A second process fluid may comprise a mixture of the third fluid and the second fluid. A second process fluid line 528 is coupled to the second three port pulsing valve 534 at one end and the junction 550 of the Y shaped weldment 508 at another end. The second three port pulsing valve 534 may be configured to pulse the third fluid into the second process fluid line 528 (and consequently into one of the plurality of inlet ports 114). In some embodiments, the second three port pulsing valve 534 is configured to provide continuous flow from the second carrier conduit 516 and pulsed flow from the third conduit 518.

A second exhaust line 522 may extend from the third conduit 518 to a foreline, such as foreline 128 or a separate foreline, of the apparatus 100. The second exhaust line 522 may include a second exhaust valve 552 that is normally closed. The first process fluid line 526 and the second process fluid line 528 merge into the single inlet line 510. In some embodiments, the single inlet line 510 includes a manometer to measure a pressure of the single inlet line 510 and configured to send pressure data to a system controller 700 of the apparatus 100 to control flow and pulse rates of the process gases.

In some embodiments, the purge source 140 extends to a purge conduit 506 extends for purging various conduits of the gas distribution assembly. In some embodiments, the purge conduit 506 extends from the second exhaust line 522 and includes a purge valve 536 to control a flow of purge gas. In some embodiments, the purge conduit 506 flows ozone ($O_3$). In some embodiments, the first fluid comprises trimethylaluminium. In some embodiments, the second fluid comprises nitrogen. In some embodiments, the third fluid comprises H2O.

Figure 6:
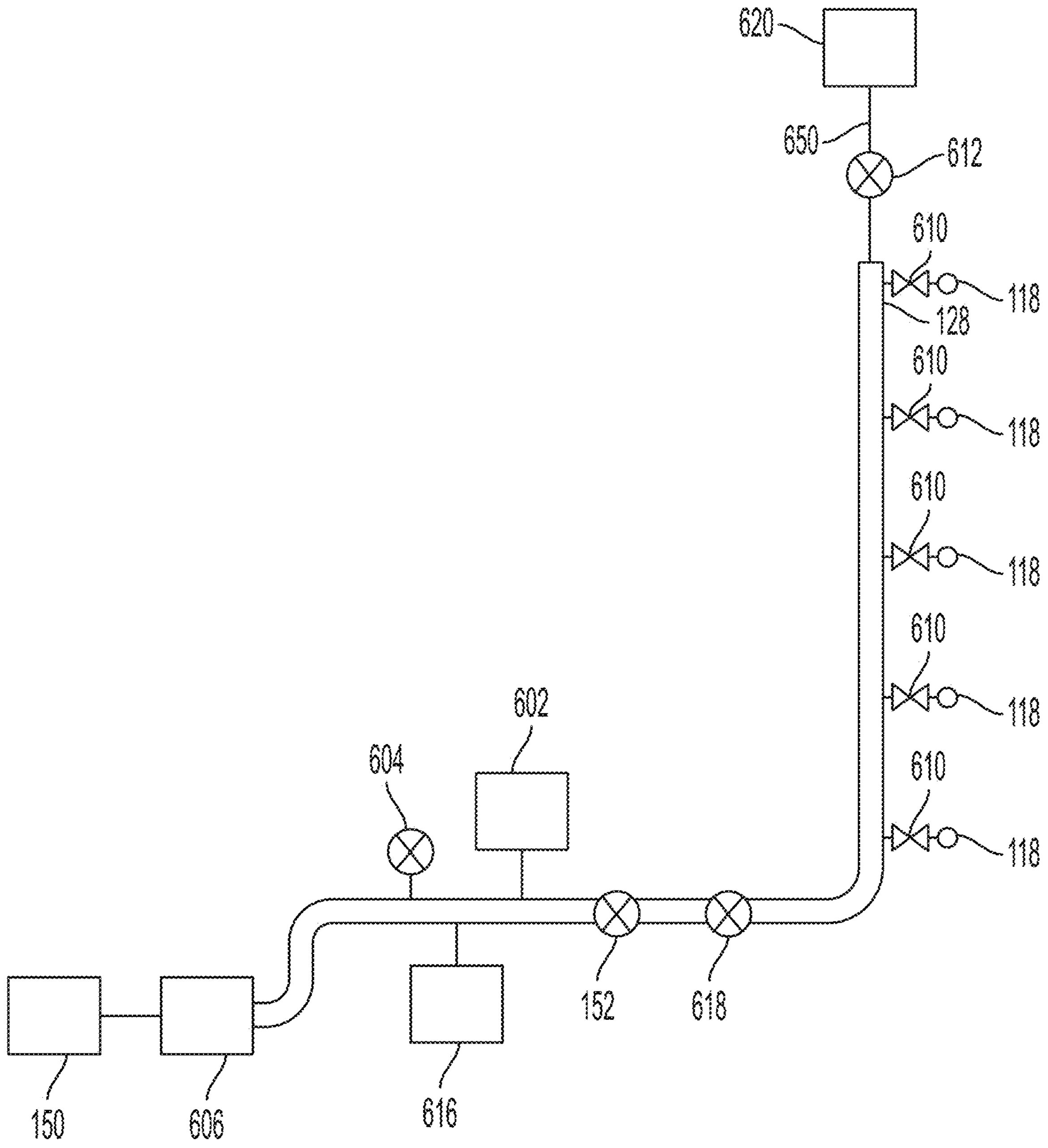
FIG. 6 depicts a schematic side view of a foreline in accordance with at least some embodiments of the present disclosure.

FIG. 6 depicts a side view of a foreline in accordance with at least some embodiments of the present disclosure. In some embodiments, a normally closed valve 610 is disposed between the foreline 128 and each of the plurality of exhaust ports 118. As such, in use, the normally closed valve 610 may be actuated to an open position when pumping down of a respective one of the plurality of gas lines 112 is desired. In some embodiments, a purge line 650 is coupled to the foreline 128 for providing a purge gas, such as nitrogen gas or the like, to the foreline 128. The purge gas may be provided from a purge gas source 620. The purge line 650 is generally coupled to the foreline 128 upstream of any of the normally closed valves 610. In some embodiments, the purge gas is provided from the fluid panel 120. The purge gas may advantageously reduce or prevent unwanted deposition or coating of the interior walls of the foreline 128 when processing fluids from the plurality of gas lines 112 pass through the foreline 128. In some embodiments, the purge line 650 includes a check valve 612 to ensure that there is no reverse flow.

The foreline 128 may include various components to aid in pressure control and measurement. For example, in some embodiments, the foreline 128 includes a throttle valve 618 downstream of the normally closed valves 610 to maintain a desired pressure in the foreline 128. In some embodiments, the foreline 128 includes a pressure switch 602 having a desired pressure set point to aid in the regulation and pumping down of the foreline 128. In some embodiments, the pressure switch 602 is disposed downstream of the isolation valve 152. The foreline 128 may include a manometer 616 for measuring pressure in the foreline 128. In some embodiments, the foreline 128 includes a manual valve 604. The manual valve 604 may be disposed downstream of the isolation valve 152. In some embodiments, the foreline 128 includes a trap 606 for containing particle contaminants and prolong the life of the pump 150. The trap 606 may include a mesh or suitable filter media to trap particle contaminants. In some embodiments, trap 606 is disposed downstream of the isolation valve 152. In some embodiments, the trap 606 is disposed downstream of the manometer 616.

Figure 7:
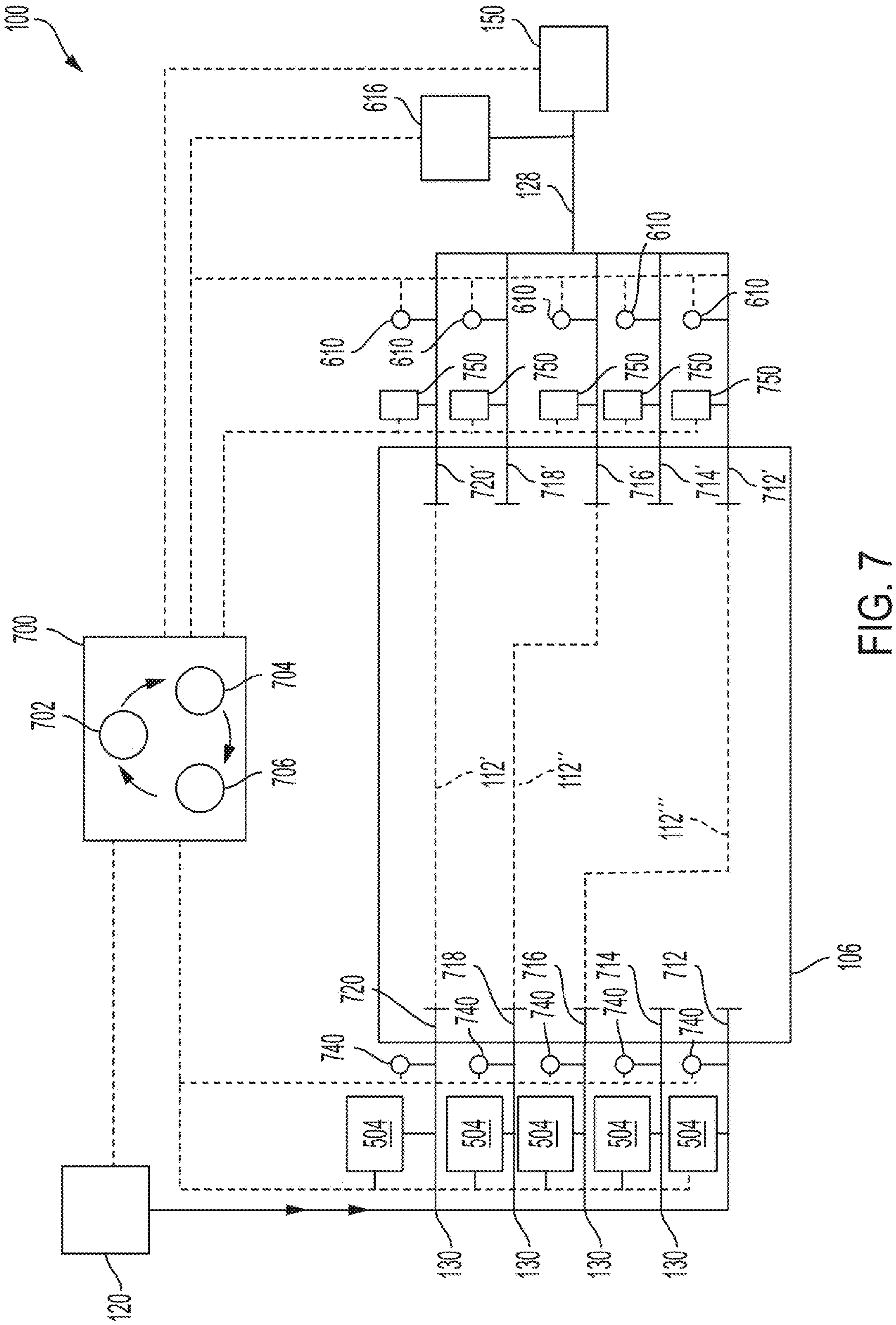
FIG. 7 depicts a schematic side view of an oven in accordance with at least some embodiments of the present disclosure.

FIG. 7 depicts a schematic side view of an oven in accordance with at least some embodiments of the present disclosure. The system controller 700 controls the operation of the apparatus 100 using by controlling the computers (or controllers) associated with the oven 102, the fluid panel 120, the fluid distribution assemblies 130, and components connected to the foreline 128. The system controller 700 generally includes a central processing unit (CPU) 702, a memory 704, and a support circuit 706. The CPU 702 may be one of any form of a general purpose computer having one or more processors that can be used in an industrial setting. The support circuit 706 is conventionally coupled to the CPU 702 and may comprise a cache, clock circuits, input/output subsystems, power supplies, and the like. Software routines, such as processing methods as described above may be stored in the memory 704 and, when executed by the CPU 702, transform the CPU 702 into a system controller 700. The software routines may also be stored and/or executed by a second controller (not shown) that is located remotely from the apparatus 100.

In operation, the system controller 700 enables data collection and feedback from the respective components of the apparatus 100 to optimize performance of the apparatus 100 and provides instructions to system components to perform the methods described herein. For example, the memory 704 can be a non-transitory computer readable storage medium having instructions that when executed by the CPU 702 (or system controller 700) perform the methods described herein.

For example, the system controller 700 may be used to check if a gas line of the plurality of gas lines 112 is present and connected to the inlet port 114 and the exhaust port 118. For example, the plurality of inlet ports 114 may include a first input port 712, a second input port 714, a third input port 716, a fourth input port 718, and a fifth input port 720. The plurality of exhaust ports 118 may correspondingly include a first exhaust port 712', a second exhaust port 714', a third exhaust port 716', a fourth exhaust port 718', and a fifth exhaust port 720'. On the input side, an inlet sensor 740 may be coupled to each port of the plurality of inlet ports 114. The inlet sensor 740 is configured to provide a signal to the system controller 700 that indicates if a gas line of the plurality of gas lines 112 is connected to that inlet port. Similarly, on the exhaust side, an output sensor 750 may be coupled to each port of the plurality of exhaust ports 118. The output sensor 750 is configured to provide a signal to the system controller 700 that indicates if a gas line of the plurality of gas lines 112 is connected to that exhaust port. As an illustration, as depicted in FIG. 7, a first gas line 112' may be connected to the fifth input port 720 and the fifth exhaust port 720', a second gas line 112" may be connected to the fourth input port 718 and the third exhaust port 716', and a third gas line 112'" may be connected to the third input port 716 and the first exhaust port 712'. In such an embodiment, the system controller 700 may recognize that the second exhaust port 714' and the forth exhaust port 718' are not coupled to any gas lines and thus, maintains the normally closed valves 610 associated with the second exhaust port 714' and the forth exhaust port 718' in a closed position. Similarly, the valves in the fluid distribution assemblies 130 associated with the first input port 712 and the second input port 714 would remain closed.

In some embodiments, the manometer 504 on the input side may provide a pressure reading to the system controller 700 for controlling flow of fluids to the plurality of inlet ports 114. In some embodiments, the manometer 616 on the foreline 128 may provide pressure readings to the system controller 700 and the system controller 700 may facilitate actuation of various valves coupled to the foreline 128 to control and regulate pressure.

Figure 8:
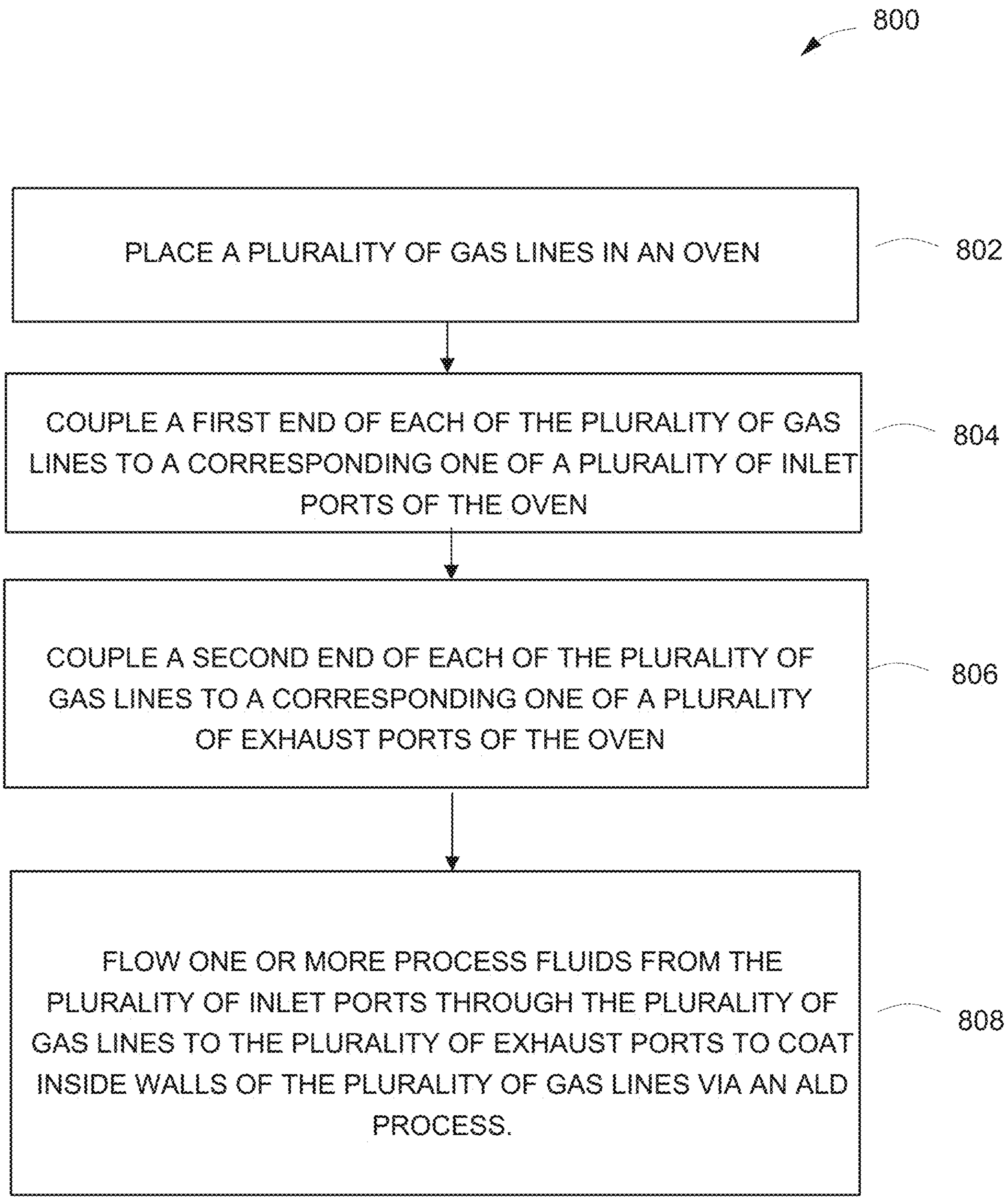
FIG. 8 depicts a flow chart of a method of simultaneously coating insides of a plurality of gas lines in accordance with at least some embodiments of the present disclosure.

FIG. 8 depicts a flow chart of a method 800 of simultaneously coating insides of a plurality of gas lines in accordance with at least some embodiments of the present disclosure. At 802, the method 800 includes placing a plurality of gas lines (e.g., plurality of gas lines 112) in an oven (e.g., oven 102). In some embodiments, placing the plurality of gas lines in the oven is performed via a rolling lifting fixture (e.g., lift fixture 400). The plurality of gas line may be hung from sidewalls of the oven or place on various fixtures or stands disposed in the oven. In some embodiments, the plurality of gas lines may be placed on trays (e.g., plurality of trays 108).

At 804, the method 800 includes coupling a first end of each of the plurality of gas lines to a corresponding one of a plurality of inlet ports (e.g., plurality of inlet ports 114) of the oven. The plurality of inlet ports may be disposed in a vertically or horizontally space apart orientation. At 806, the method 800 includes coupling a second end of each of the plurality of gas lines to a corresponding one of a plurality of exhaust ports (e.g., plurality of exhaust ports 118) of the oven.

At 808, the method 800 includes flowing one or more process fluids from the plurality of inlet ports through the plurality gas lines to the plurality of exhaust ports to coat inside walls of the plurality of gas lines via an ALD process. The one or more process fluids may be supplied via a fluid panel (e.g., fluid panel 120). In some embodiments, a fluid distribution assembly (e.g., fluid distribution assembly 130) may be used to mix and deliver the one or more process fluids. In some embodiments, the fluid distribution assembly provides the process fluids in a desired ratio or desired pulse rate at desired intervals. For example, the fluid distribution assembly may be configured to pulse a first fluid at a rate of less about 200 millisecond and pulse a second fluid at a rate of about 200 millisecond. In some embodiments, ozone is flowed through conduits of the fluid distribution assembly 130 to clean or purge the conduits prior to or after flowing the one or more process fluids through the conduits. In some embodiments, the pulsed first fluid may be followed by a 1 to 4 second purge. In some embodiments, the pulsed third fluid may be followed by a 1 to 4 second purge. In some embodiments, the inside walls of the plurality of gas lines are coated with a coating, such as an aluminum oxide coating, having a thickness of about 4000 to about 6000 angstroms.

In some embodiments, the one or more process fluids comprise nitrogen, trimethylaluminium (TMA), and $H_2O$. In some embodiments, the interior volume 110 of the oven 102 is heated to about 200 to about 500 degrees Celsius during processing. In some embodiments, the pressure inside of the plurality of gas lines is maintained at about 1 to about 100 Torr during processing. The interior volume of the oven may be maintained at a pressure of about 1.5 to about 650 Torr, for example about 1.5 to about 10 Torr. In some embodiments, the method 800 includes flowing an inert gas into an interior volume of the oven while flowing the one or more process fluids.

In some embodiments, a valve (e.g., normally closed valve 610) is coupled to each of the plurality of exhaust ports. In some embodiments, the method 800 includes keeping the valves closed while coupling the first end of each of the plurality of gas lines and the second end of each of the plurality of gas lines. The method 800 may include opening the valves when performing the ALD process. The method 800 may include only opening the valves that are coupled to a gas line and keeping the valves that are not connected to a gas line closed during ALD processing. In some embodiments, the oven 102 is cooled to about 30 to about 70 Celsius after processing is complete.

While the foregoing is directed to embodiments of the present disclosure, other and further embodiments of the disclosure may be devised without departing from the basic scope thereof.

The invention claimed is:

1. An apparatus for coating a plurality of gas lines via an ALD process, comprising:

an oven having an enclosure that defines an interior volume configured to house the plurality of gas lines, the enclosure having one or more doors configured for transferring the plurality of gas lines into and out of the interior volume;

a plurality of inlet ports disposed through a first wall of the enclosure, wherein each of the plurality of inlet ports are configured for coupling to a first end of a corresponding one of the plurality of gas lines;

a plurality of exhaust ports disposed through a second wall of the enclosure, wherein each of the plurality of exhaust ports are configured for coupling to a second end of a corresponding one of the plurality of gas lines;

a fluid panel disposed outside of the oven and coupled to the plurality of inlet ports via corresponding ones of a plurality of fluid distribution assemblies; and a foreline disposed outside of the oven and coupled to the plurality of exhaust ports.

2. The apparatus of claim 1, wherein the plurality of exhaust ports are arranged in a vertically spaced apart orientation proximate the one or more doors.

3. The apparatus of claim 1, wherein the plurality of fluid distribution assemblies are arranged in a vertically spaced apart orientation.

4. The apparatus of claim 1, further comprising a normally closed valve disposed between the foreline and each of the plurality of exhaust ports.

5. The apparatus of claim 1, wherein each of the plurality of fluid distribution assemblies include a plurality of process fluid supply lines that converge into a single inlet line that is coupled to each of the plurality of inlet ports.

6. The apparatus of claim 5, wherein the plurality of process fluid supply lines comprises a nitrogen gas supply line, a water supply line, and a trimethylaluminium (TMA) supply line.

7. The apparatus of claim 1, wherein the foreline includes a trap for containing particle contaminants.

8. The apparatus of claim 1, wherein the apparatus is configured to arrange the plurality of gas lines in a vertically spaced apart orientation.

9. The apparatus of claim 1, further comprising a plurality of trays disposed in the interior volume configured to hold the plurality of gas lines thereon.

10. An apparatus for coating a plurality of gas lines via an ALD process, comprising:

an oven having an enclosure that defines an interior volume configured to house the plurality of gas lines, the enclosure having one or more doors configured for transferring the plurality of gas lines into and out of the interior volume;

a plurality of inlet ports disposed through a first wall of the enclosure and arranged in a vertically spaced apart orientation, wherein each of the plurality of inlet ports are configured for coupling to a first end of a corresponding one of the plurality of gas lines;

a plurality of exhaust ports disposed through a second wall of the enclosure and arranged in a vertically spaced apart orientation, wherein each of the plurality of exhaust ports are configured for coupling to a second end of a corresponding one of the plurality of gas lines;

a plurality of trays disposed in the interior volume configured to hold the plurality of gas lines thereon;

a fluid panel disposed outside of the oven and coupled to the plurality of inlet ports via corresponding ones of a plurality of fluid distribution assemblies; and a foreline disposed outside of the oven and coupled to the plurality of exhaust ports.

11. The apparatus of claim 10, wherein the oven includes a recirculation input port and a recirculation output port.

12. The apparatus of claim 10, wherein the plurality of fluid distribution assemblies include a Y shaped weldment configured to merge multiple process fluids while minimizing chemical vapor deposition in the Y shaped weldment.

13. The apparatus of claim 10, wherein the plurality of inlet ports and the plurality of exhaust ports are disposed proximate the one or more doors.

14. The apparatus of claim 10, further comprising a purge line coupled to the foreline upstream of the plurality of exhaust ports.

15. A method of simultaneously coating insides of a plurality of gas lines, comprising:

placing the plurality of gas lines in the oven of the apparatus of claim 1 a plurality of gas lines in an oven;

coupling a first end of each of the plurality of gas lines to a corresponding one of the plurality of inlet ports of the oven;

coupling a second end of each of the plurality of gas lines to a corresponding one of the plurality of exhaust ports of the oven; and flowing one or more process fluids from the plurality of inlet ports through the plurality of gas lines to the plurality of exhaust ports to coat inside walls of the plurality of gas lines via an ALD process.

16. The method of claim 15, wherein the one or more process fluids comprise nitrogen, trimethylaluminium (TMA), and ozone.

17. The method of claim 15, wherein the placing the plurality of gas lines in the oven is performed via a rolling lifting fixture.

18. The method of claim 15, wherein a valve is coupled to each of the plurality of exhaust ports, and further comprising closing the valve while coupling the first end of each of the plurality of gas lines and the second end of each of the plurality of gas lines and opening the valve when performing the ALD process.

19. The method of claim 15, further comprising flowing an inert gas into an interior volume of the oven while flowing the one or more process fluids.

20. A non-transitory computer readable medium, that when executed via one or more processors, performs the method of claim 15.

* * * * *